US010998765B2

(12) United States Patent
Coquinco

(10) Patent No.: US 10,998,765 B2
(45) Date of Patent: May 4, 2021

(54) SELECTABLE POWER SCAVENGING SYSTEMS AND METHODS

(71) Applicant: Awesense Wireless, Inc., Vancouver (CA)

(72) Inventor: Bernard Coquinco, Richmond (CA)

(73) Assignee: Awesense Inc., Vancouver (CA)

( * ) Notice: Subject to any disclaimer, the term of this patent is extended or adjusted under 35 U.S.C. 154(b) by 0 days.

(21) Appl. No.: 16/490,886

(22) PCT Filed: Mar. 1, 2018

(86) PCT No.: PCT/IB2018/000285
§ 371 (c)(1),
(2) Date: Sep. 3, 2019

(87) PCT Pub. No.: WO2018/158640
PCT Pub. Date: Sep. 7, 2018

(65) Prior Publication Data
US 2020/0020480 A1    Jan. 16, 2020

Related U.S. Application Data

(60) Provisional application No. 62/466,297, filed on Mar. 2, 2017.

(51) Int. Cl.
*H02M 7/06*    (2006.01)
*H02J 50/00*    (2016.01)
(Continued)

(52) U.S. Cl.
CPC ............ *H02J 50/001* (2020.01); *G05F 1/613* (2013.01); *H02M 7/06* (2013.01); *G01R 15/186* (2013.01); *G05F 3/18* (2013.01)

(58) Field of Classification Search
CPC ...... H02J 50/001; H02J 7/025; G01R 15/186; G05F 1/613; G05F 3/16; H02M 7/06
See application file for complete search history.

(56) References Cited

U.S. PATENT DOCUMENTS 4,672,501 A * 6/1987 Bilac .................... H02H 3/0935
361/42
5,117,325 A * 5/1992 Dunk ....................... H02H 3/06
361/71

(Continued)

OTHER PUBLICATIONS

Christian Bach, Current Sensor—Power Line Monitoring for Energy Demand Control, Jan. 2015, pp. 1-4, Application Note 308, EnOcean, Germany.

*Primary Examiner* — Harry R Behm
(74) *Attorney, Agent, or Firm* — ÆON Law; Adam L.K. Philipp; Jonathan E. Olson

(57) ABSTRACT

Methods and systems are presented for configuring a rectifier across a secondary side of a current transformer; configuring circuitry to harvest energy across one or more loads coupled across an output of the rectifier selectively in response to an indication that a variable line current at a primary side of the current transformer is small enough; configuring circuitry to shunt at least a first load of the one or more loads coupled across the output of the rectifier selectively in response to an indication that a line current at the primary side is large enough; and configuring circuitry to harvest energy across the first load of the one or more loads coupled across the output of the rectifier again selectively in response to an indication that a line current at the primary side is again small enough.

20 Claims, 5 Drawing Sheets

(51) Int. Cl.
  *G05F 1/613* (2006.01)
  *G01R 15/18* (2006.01)
  *G05F 3/18* (2006.01)

(56) References Cited

U.S. PATENT DOCUMENTS

| | | | |
|---|---|---|---|
| 5,426,360 A * | 6/1995 | Maraio | G01R 15/142 |
| | | | 324/126 |
| 5,552,978 A * | 9/1996 | Moncorge | G01R 1/20 |
| | | | 323/223 |
| 8,161,310 B2 | 4/2012 | Cagno et al. | |
| 9,401,356 B2 | 7/2016 | Zeng et al. | |
| 9,529,021 B2 | 12/2016 | Peczalski et al. | |
| 9,543,072 B2 | 1/2017 | Vos | |
| 9,653,926 B2 | 5/2017 | Park et al. | |
| 9,673,696 B2 | 6/2017 | Lu et al. | |
| 9,806,527 B1 | 10/2017 | Olah et al. | |
| 9,831,669 B1 | 11/2017 | Che et al. | |
| 9,853,441 B2 | 12/2017 | Teggatz et al. | |
| 9,876,384 B2 | 1/2018 | Liu | |
| 2008/0265793 A1* | 10/2008 | Gurr | H05B 45/10 |
| | | | 315/225 |
| 2017/0030952 A1* | 2/2017 | Shamir | G01R 21/14 |
| 2017/0162320 A1* | 6/2017 | Rumrill | G01R 15/207 |
| 2019/0280526 A1* | 9/2019 | Na | H02M 5/12 |

\* cited by examiner

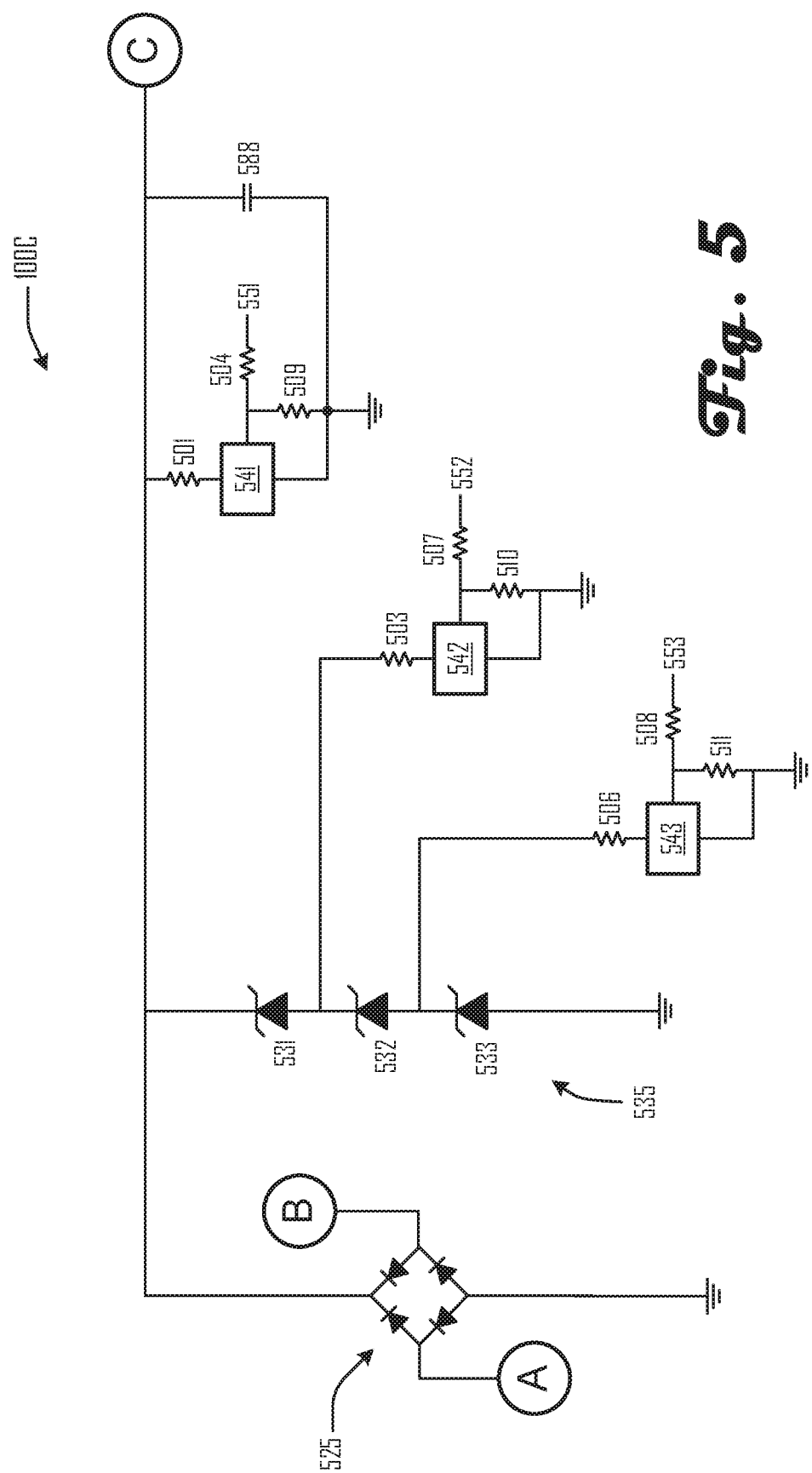

SELECTABLE POWER SCAVENGING SYSTEMS AND METHODS

BACKGROUND

Electric-power transmission refers to the bulk transfer of electrical energy, e.g. in the form of high-voltage three-phase alternating current (AC), via transmission lines from one or more generating power plants to one or more electrical substations. Electric-power transmission systems may be distinct from the local wiring between high-voltage substations and customers, which may be referred to as electric power distribution. Transmission lines, when interconnected with each other, become transmission networks referred to as power grids and/or electrical grids. Such a power grid may be distributed across a relatively large physical area.

A key limitation in the distribution of electricity is that, with minor exceptions, electrical energy cannot be stored, and therefore must be generated as needed. A sophisticated system of measurement and control may be used to ensure electric generation very closely matches the demand. If supply and demand are not in balance, generation plants and transmission equipment can shut down which, in the worst cases, can lead to a major regional blackout. To reduce the risk of such failures, electric transmission networks may be interconnected into regional, national or continental wide networks thereby providing multiple redundant alternate routes for power to flow should a failure occur.

To monitor the state of a power grid it may be advantageous to deploy portable sensor devices at various points on the power grid in order to detect such failures. However, such portable sensor device may themselves may require electrical power in order to operate and, because of the distributed nature of power grids, such portable sensor devices may need to be placed in locations without ready access to usable power sources. Therefore, such sensors can only be used for as long as there is sufficient charge stored in the sensor's battery or they have some means of harvesting power from the environment, such as from a solar panel. The power lines being monitored by a sensor may be bridged to collect power for the sensor, but due to the very high voltages involved, such a sensor may be both heavy and difficult to use. As a result, portable transmission line senor devices have been designed with energy harvesting features such as solar panels or inductive charging from the power line.

Inductive charging based off current transformers may require less maintenance than other techniques such as solar charging, but the charge rate to the sensor device's battery may depend on the current flowing through the power line ($I_{Line}$). As a result, there a minimum required line current must be present in order for the sensor device to be self-sustaining.

It may be possible to optimize the current transformer used for energy harvesting either high or low line currents. The current generated on the transformer's output ($I_o$) is dictated by the formula:

$$I_o = I_{Line} \frac{N_{Line}}{N_S}$$

where $N_{Line}$ is the number of windings on the line side of the transformer and $N_S$ is the number of windings on the secondary side. $N_{Line}$ may equal 1 for use on a power line.

Having low value of $N_S$ means more power is generated on when there is a low line current ($I_{Line}$) but it also means that at a high line current, a large amount of power must be either used or dissipated. As a current transformer is a current source rather than a voltage source, the current generated must be either dissipated or used otherwise excessive voltage will be generated that can damage the portable sensor device. Furthermore, since the current transformer output current ($I_o$) is directly related to the line current ($I_{Line}$), the portable sensor device has no control over how much current it needs to dissipate. As a result, there is a tradeoff in which a portable sensor device can be optimized for low current but cannot tolerate as wide a range of line currents or the portable sensor device may be optimized for a wide range of line currents but the amount of energy able to be harvested is limited at low line currents, so the portable sensor device may not be self-sustaining at such a low line current.

Furthermore, if a portable sensor device is optimized for operating with low line currents, at high line currents a significant amount of heat may need to be dissipated. However, since these portable sensor devices need to be operable in a wide variety of environmental conditions, so they may need to be sealed against moisture and rain. As a result, it becomes very difficult to dissipate heat as there is no airflow available to remove it.

Some implementations consist of a current transformer followed by one or more clamping Zener diode(s) and a rectifier of some sort. A Zener diode allows current to flow from its anode to its cathode like a normal semiconductor diode, but it also permits current to flow in the reverse direction when its "Zener voltage" ($V_z$) is reached. To compensate for high current scenarios, the clamping diodes need to have a low enough Zener voltage so that they do not overheat. Overheating can occur if all the current being generated isn't used such as if the scavenge circuit is charging a battery and the battery is now full. Since charge isn't being consumed, the battery voltage will rise and a Zener diode will eventually conduct, and power P will be dissipated at a rate of:

$$P = IV_z$$

where I is the current passing through the Zener diode. However, this may cause issues at relatively low line currents, as Zener diodes leak current as the voltage approaches the Zener voltage, so the energy harvesting at low currents is limited.

If you optimize for low currents by using any combination of high $V_z$, low leakage Zener diodes, and possibly voltage amplifiers such as a Cockcroft-Walton multiplier, voltage at the low end is increased but it is also increased on the high end. Furthermore, it limits how much power may be harvested under higher line conditions. Increasing the turns ratio of the current transformer has the same effect.

To balance these effects, a static or dynamic resistive load may help limit the voltage swing. However, this will constantly drain current and may still allow spikes that are higher than intended when there are line faults or other causes of spikes in current.

BRIEF DESCRIPTION OF THE DRAWINGS

FIG. 5 illustrates another exemplary circuit schematic in accordance with one or more embodiments.

DETAILED DESCRIPTION

Figure 1:
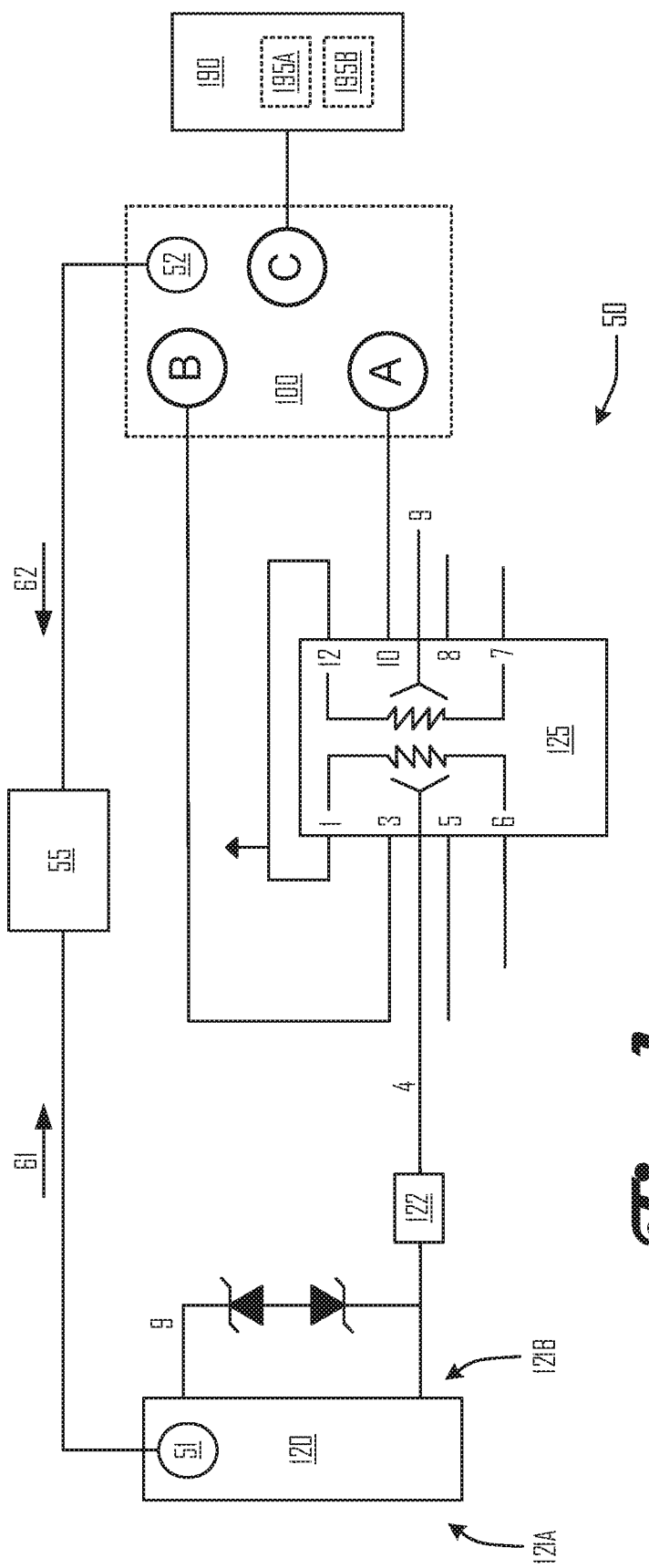
FIG. 1 illustrates an exemplary contextual schematic in accordance with one or more embodiments.

The detailed description that follows is represented largely in terms of processes and symbolic representations of operations by conventional computer components, including a processor, memory storage devices for the processor, connected display devices and input devices. Furthermore, some of these processes and operations may utilize conventional computer components in a heterogeneous distributed computing environment, including remote file servers, computer servers and memory storage devices.

The phrases "in one embodiment," "in various embodiments," "in some embodiments," and the like are used repeatedly. Such phrases do not necessarily refer to the same embodiment. The terms "comprising," "having," and "including" are synonymous, unless the context dictates otherwise. Such terms do not generally signify a closed list.

Various embodiments of the present power scavenging circuit may scavenge power at both low line currents as well as at high line currents using the same circuit without the use of large heatsinks and fans so it is useable even in sealed environments.

Various embodiments of the present power scavenging circuit may be operated in such a way that it is optimized for scavenging at low currents by reducing leakage effects. At the same time, we can optimize charging the device at high line currents so that the actual amount of heat generated under these conditions is greatly reduced. In some embodiments, this optimization may be done by microcontroller control.

"Across," "again," "at," "closed," "comprising," "configured," "coupled," "each," "effective," "enough," "first," "fully," "greater," "in," "incorporated," "indicated," "large," "low," "more," "of," "off," "on," "primary," "respective," "responsive," "said," "second," "secondary," "selectively," "shorted," "shunted," "small," "solid," "still," "wherein," or other such descriptors herein are used in their normal yes-or-no sense, not merely as terms of degree, unless context dictates otherwise. In light of the present disclosure those skilled in the art will understand from context what is meant by "remote" and by other such positional descriptors used herein. Terms like "processor," "center," "unit," "computer," or other such descriptors herein are used in their normal sense, in reference to an inanimate structure. Such terms do not include any people, irrespective of their location or employment or other association with the thing described, unless context dictates otherwise. "For" is not used to articulate a mere intended purpose in phrases like "circuitry for" or "instruction for," moreover, but is used normally, in descriptively identifying special purpose software or structures. As used herein, the term "contemporaneous" refers to circumstances or events that are concurrent or at least roughly contemporaneous (on the same day, e.g.).

Reference is now made in detail to the description of the embodiments as illustrated in the drawings. While embodiments are described in connection with the drawings and related descriptions, there is no intent to limit the scope to the embodiments disclosed herein. On the contrary, the intent is to cover all alternatives, modifications and equivalents. In alternate embodiments, additional devices, or combinations of illustrated devices, may be added to, or combined, without limiting the scope to the embodiments disclosed herein.

FIG. 1 illustrates an exemplary contextual schematic in accordance with one or more embodiments. As shown, a power scavenging system 50 includes a current transformer 120 configured so that a number of windings on the secondary side 121B is greater than a number of windings on the primary side 121A. Pins 1 and 12 of a suitable signal relay (a TXS2SA-L2-3V-Z, e.g.) are coupled to nominal 5 volt power source (VCC). Pins 5 and 8 may be unused. Pin 4 may be coupled via fuse 122 to a terminal of secondary side 121B (optionally with a waveform clipper) as shown. Pin 9 may be coupled to an opposite terminal of secondary side 121B as shown. Pins 6 and 7 may be control inputs (provided by microcontroller 55, e.g.). Pins 3 and 10 may be respectively coupled to inputs of scavenging rectifier circuit 100 as shown. Microcontroller 55 may receive one or more indications 61 (directly or indirectly indicative of a magnitude of a line current, e.g.) from a sensor unit 51 as shown. Alternatively or additionally, scavenging rectifier circuit 100 may include a sensor unit 52 (therein or adjacent, e.g.) configured to provide one or more indications indirectly indicative of a magnitude of the line current. One or more components (rectifiers, e.g.) of a scavenging rectifier circuit 100 (via signal relay 125) span across the secondary side 121B of the current transformer 120 as shown. When scavenging rectifier circuit 100 is active (i.e. scavenging), a power output is provided to one or more storage devices 195A-B of an energy harvesting circuit 190 as shown. Additional detail is provided below.

Figure 2:
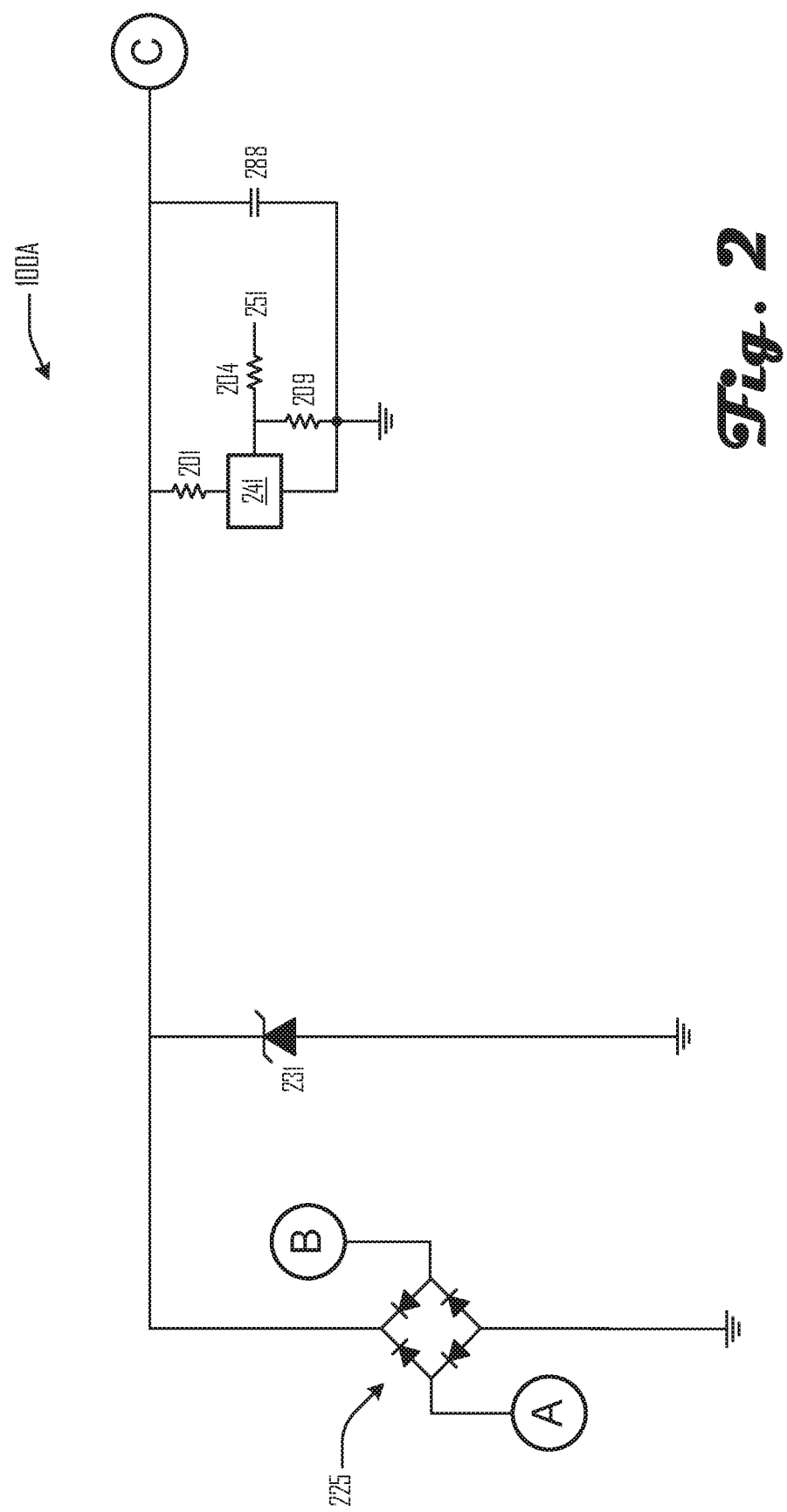
FIG. 2 illustrates an exemplary circuit schematic in accordance with one or more embodiments.

FIG. 2 illustrates an exemplary scavenging rectifier circuit 100A in accordance with one or more embodiments. In this relatively simple variant, a single load 231 is used in conjunction with a switchable shunt 241 (implemented as a latching relay or field effect transistor, e.g.) and bridge rectifier 225 as shown. (Although many instances of loads 231 are depicted herein as Zener diodes it will be understood that other types of loads may also serve, depending upon the particular implementation.) Outputs "A" and "B" (at pins 10 and 3 of signal relay 125, e.g.) form respective inputs to bridge rectifier 225 and an output of bridge rectifier 225 is operably coupled to a terminal of load 231. When shunt 241 remains open/off, rectified current may charge capacitor 288. But shunt 241 (when turned on by an input 251 from microcontroller 55 through input resistor 204, e.g.) effectively shorts out the current transformer 120 when appropriate (in response to microcontroller 55 obtaining an indication that the line current or load temperature is becoming high enough to risk component damage, e.g.). In some variants input resistor 204 is roughly 470 ohms, current-limiting resistor 201 is roughly 0.25 ohms, and biasing resistor 209 is roughly 100 kilohms. As used herein "roughly" means within two orders of magnitude (i.e. less than a factor of 100, e.g.) unless context dictates otherwise.

In the interest of concision and according to standard usage in information management technologies, the functional attributes of some modules described herein are set forth in natural language expressions. It will be understood by those skilled in the art that such expressions (functions or acts recited in English, e.g.) adequately describe structures identified below so that no undue experimentation will be required for their implementation. For example, any records or other informational data identified herein may easily be represented digitally as a voltage configuration on one or more electrical nodes (conductive pads of an integrated circuit, e.g.) of an event-sequencing structure without any undue experimentation. Each electrical node is highly conductive, having a corresponding nominal voltage level that is spatially uniform generally throughout the node (within a device or local system as described herein, e.g.) at relevant times (at clock transitions, e.g.). Such nodes (lines on an integrated circuit or circuit board, e.g.) may each comprise a forked or other signal path adjacent one or more transistors. Moreover many Boolean values (yes-or-no decisions, e.g.) may each be manifested as either a "low" or "high" voltage, for example, according to a complementary metal-oxide-semiconductor (CMOS), emitter-coupled logic (ECL), or other common semiconductor configuration protocol. In some contexts, for example, one skilled in the art will recognize an "electrical node set" as used herein in reference to one or more electrically conductive nodes upon which a voltage configuration (of one voltage at each node, for example, with each voltage characterized as either high or low) manifests a yes/no decision, a digital expression of a threshold or comparison result, or other digital data.

Figure 3:
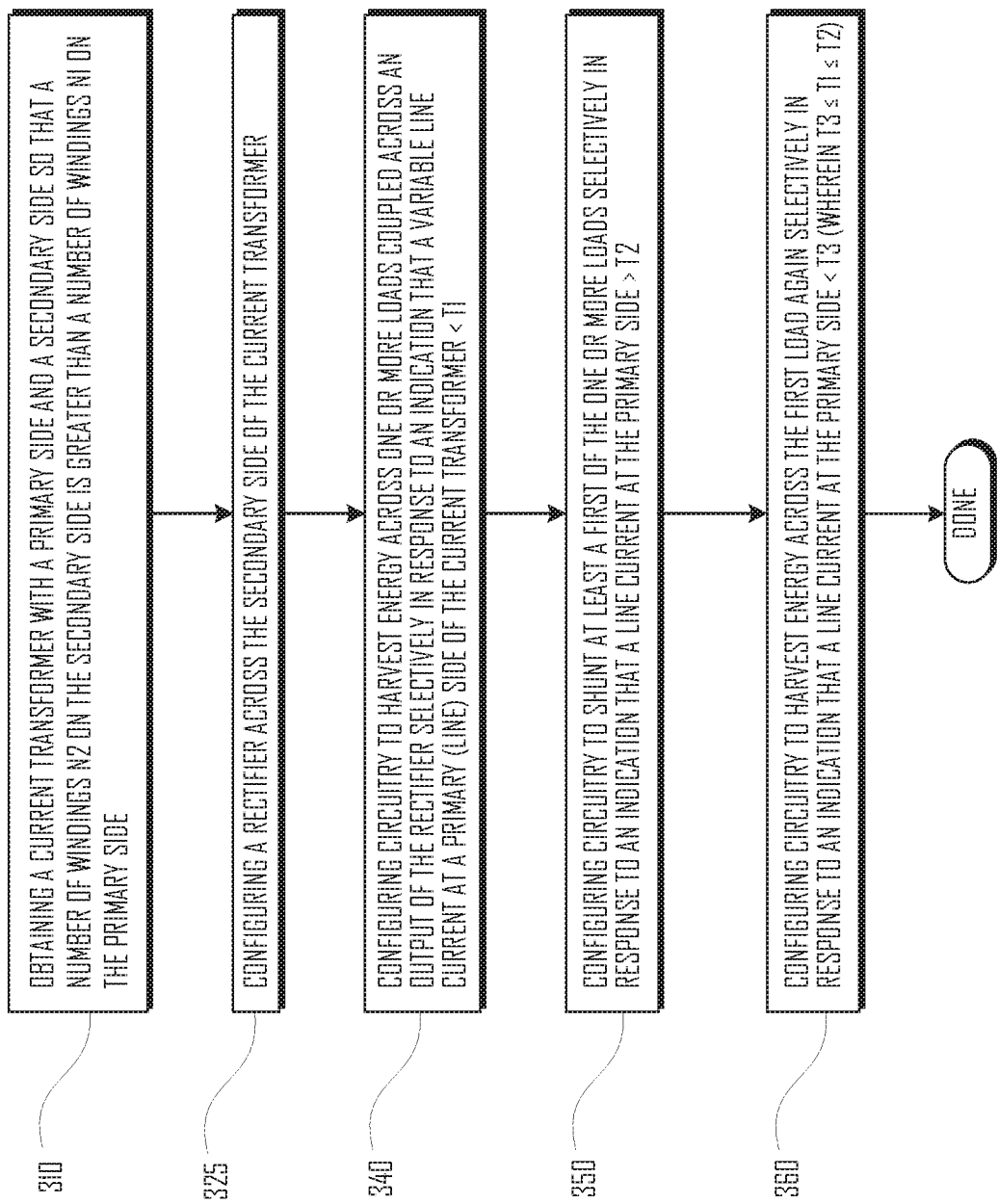
FIG. 3 illustrates an event-sequencing flow in which one or more technologies may be implemented.

FIG. 3 illustrates an event-sequencing flow 300 in which one or more technologies may be implemented. As will be recognized by those having ordinary skill in the art, not all events of power scavenging are illustrated in FIG. 3. Rather, for clarity, only those steps reasonably relevant to describing the responsive control and configuration aspects of flow 300 are shown and described. Those having ordinary skill in the art will also recognize the present flow is merely one exemplary embodiment and that variations on the present embodiment may be made without departing from the scope of the broader inventive concept set forth in the clauses and claims below.

Operation 310 depicts obtaining a current transformer with a primary side and a secondary side so that a number of windings on the secondary side is greater than a number of windings on the primary side (accessing current transformer 120 with a primary side 121A and a secondary side 121B, e.g.).

Operation 325 depicts configuring one or more rectifiers across the secondary side of the current transformer (attaching a portable device that includes bridge rectifier 225, e.g.). One skilled in the art will recognize various other suitable configurations, including those described below.

Operation 340 depicts configuring circuitry to harvest energy (including one or more instances of scavenging rectifier circuits 100, signal relays 125, energy harvesting circuits 190, or a combination thereof, e.g.) across one or more loads coupled across an output of at least one of the rectifier(s) selectively in response to an indication that a variable line current at a primary side of the current transformer is smaller in magnitude than a first threshold T1 (a module/routine of microprocessor 55 harvesting energy across opposite terminals of one or more loads 231 across an output of rectifier 225 selectively in response to an indication that a variable line current at primary side 121A of current transformer 120 is small enough, e.g.). This can occur, for example, in a context in which an installer configures microprocessor 55 to implement appropriate thresholds directly or indirectly compared to a present magnitude of the line current at primary side 121A (expressed as a root-mean-square value, e.g.).

Operation 350 depicts configuring circuitry to shunt at least a first of the one or more loads coupled across the output of the rectifier selectively in response to an indication that a line current at the primary side 121A is larger in magnitude than a second threshold T2 (a module/routine of microprocessor 55 implementing or triggering circuitry to shunt at least an instance of load 231 selectively in response to an indication that a line current at the primary side 121A is large enough, e.g.). This can occur, for example, in a context in which an installer configures microprocessor 55 to implement an appropriate T2 directly or indirectly compared to a present magnitude of the line current at primary side 121A. Alternatively or additionally, T2 can be dynamically determined according to installer-defined criteria or equal to T1 (or both).

Operation 360 depicts configuring circuitry to harvest energy across the first of the one or more loads coupled across the output of the rectifier again selectively in response to an indication that a line current at the primary side is again small enough (below a threshold T1, e.g.). This can occur, for example, in a context in which microprocessor 55 to implements an appropriate determination directly or indirectly determining whether a present magnitude of the line current at primary side 121A is low enough to resume harvesting energy across load 231. Alternatively or additionally, the applicable effective threshold T1 can be dynamically determined according to installer-defined criteria (indicative of component safety, e.g.) or equal to T2 (or both).

Figure 4:
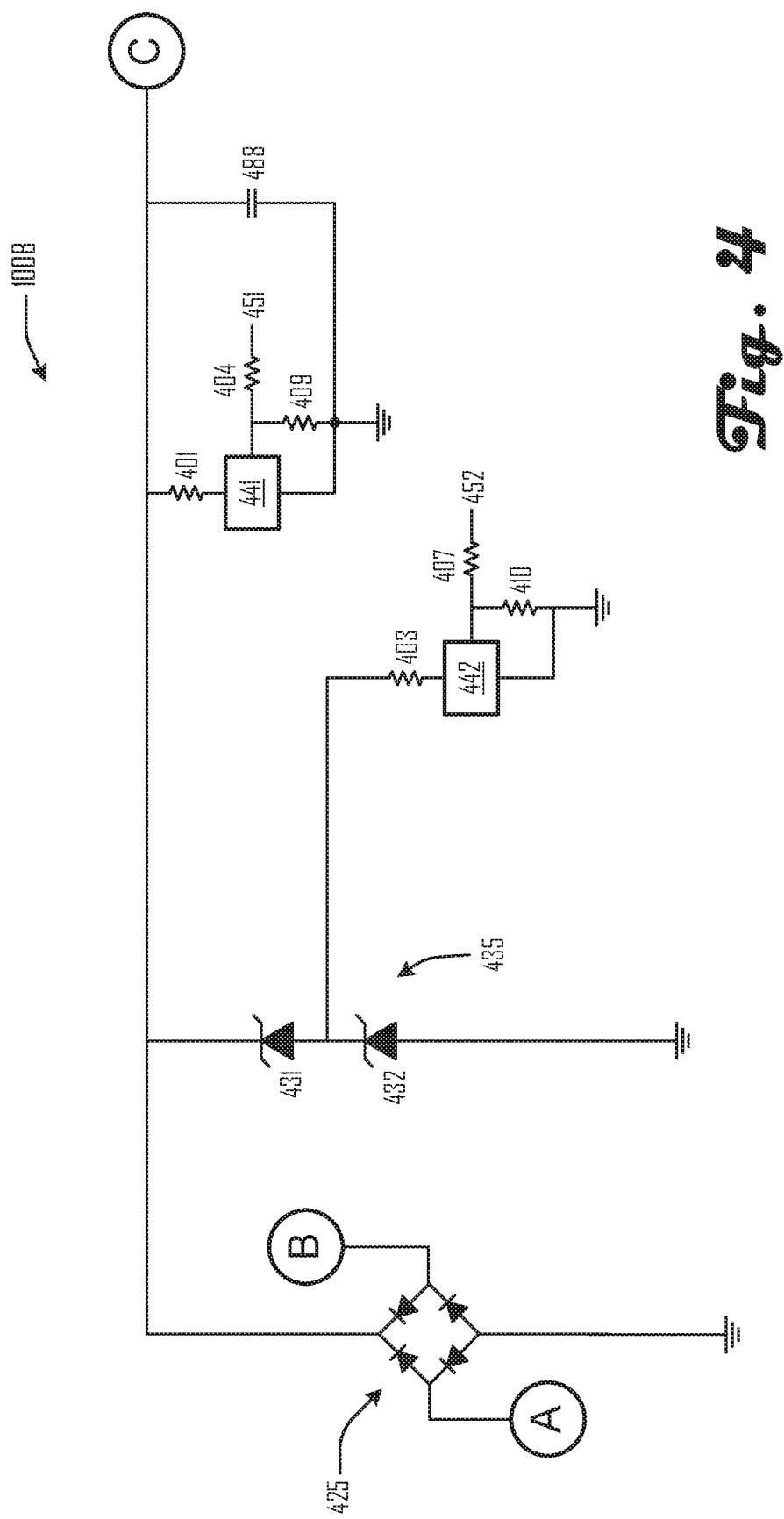
FIG. 4 illustrates another exemplary circuit schematic in accordance with one or more embodiments.

FIG. 4 illustrates another exemplary scavenging rectifier circuit 100B in accordance with one or more embodiments. In this variant a load stack 435 (including at least two shuntable loads 431, 432 as shown) is used in conjunction with a switchable shunt 442 (implemented as a latching relay or field effect transistor, e.g.) and bridge rectifier 425 as shown. Outputs "A" and "B" (at pins 10 and 3 of signal relay 125 as exemplified in FIG. 1, e.g.) form respective inputs to a bridge rectifier 425 and an output of bridge rectifier 425 is operably coupled to a terminal of the load stack 435. When shunts 441, 442 both remain open/off, rectified current may charge capacitor 488. But under appropriate circumstances (as described above with reference to FIG. 3, e.g.) shunt 442 may (when turned on by an input 452 from microcontroller 55 through input resistor 407, e.g.) effectively shunt load 432 (selectively in response to microcontroller 55 obtaining an indication that the line current is becoming high enough to risk component damage, e.g.). When load 432 is shunted to ground, scavenging rectifier circuit 100B essentially resembles scavenging rectifier circuit 100A as described above.

As such under appropriate circumstances (in a further instance as described above) shunt 441 may (when turned on by an input 451 from microcontroller 55 through input resistor 404, e.g.) effectively shunt load 432 (selectively in response to microcontroller 55 obtaining an indication that the line current is becoming high enough to risk component damage even with load 432 shunted, e.g.). In some variants input resistors 404, 407 are each roughly 470 ohms, current-limiting resistors 401, 403 are each roughly 0.25 ohms, and biasing resistors 409, 410 are each roughly 100 kilohms.

FIG. 5 illustrates another exemplary scavenging rectifier circuit 100C in accordance with one or more embodiments. As shown a load stack 535 (including more than two shuntable loads 531, 532, 533 in some variants) is used in conjunction with a switchable shunt 543 (implemented as a latching relay or field effect transistor, e.g.) and bridge rectifier 525 as shown. Relay outputs "A" and "B" (at pins 10 and 3 of signal relay 125 as exemplified in FIG. 1, e.g.) form respective inputs to a bridge rectifier 525 and an output of bridge rectifier 525 is operably coupled to a terminal of the load stack 535. When shunts 541, 542, 543 all remain open/off, rectified current may charge capacitor 588 and provide an output "C" to an energy harvesting circuit 190 (voltage regulator, e.g.). But under appropriate circumstances (as described above with reference to FIG. 3, e.g.) shunt 543 may (when turned on by an input 553 from microcontroller 55 through input resistor 508, e.g.) effectively shunt load 533 (selectively in response to microcontroller 55 obtaining an indication that the line current is becoming high enough to risk component damage, e.g.). When load 533 is shunted to ground, scavenging rectifier circuit 100C effectively operates like scavenging rectifier circuit 100B as described above.

As such under appropriate circumstances (in a further instance of flow 300 as described above) shunt 541 may (when turned on by an input 552 from microcontroller 55 through input resistor 507, e.g.) effectively shunt load 532 (selectively in response to microcontroller 55 obtaining an indication that the line current is becoming high enough to risk component damage even with load 533 shunted, e.g.). In a context in which the Zener voltage is nominally 5.1 volts, selectively shunting both load 532 and load 533 can reduce the nominal maximum voltage seen at capacitor 588 by more than a factor of two (from 15.3 volts to 5.1 volts, e.g.). This is a much better configuration for safely harvesting power when line current is running high (at an above-average magnitude within its rated power transmission levels, e.g.) for a prolonged period (ten minutes or more, e.g.).

Also as such under appropriate circumstances (in a further instance as described above) shunt 541 may (when turned on by an input 551 from microcontroller 55 through input resistor 504, e.g.) effectively shunt load 531 (selectively in response to microcontroller 55 obtaining an indication that the line current is becoming high enough to risk component damage even with all of the other loads 532, 533 shunted, e.g.). In some variants input resistors 504, 507, 508 are each roughly 470 ohms, current-limiting resistors 501, 503, 506 are each roughly 0.25 ohms, and biasing resistors 509, 510, 511 are each roughly 100 kilohms.

In some variants, scavenging rectifier circuits 100 described above may utilize a stack 435, 535 of multiple loads as a clamp with a field effect transistor (FET) between each Zener diode to allow selectively shorting out one or more of the loads. For example, a stack of three Zener diodes each with a Zener voltage of 5.1V can effectively provide an effective net Zener voltage of 15.3 V, 10.2 V, 5.1 V or 0 V selectively. The high Zener voltage limits losses at low currents while the lower Zener voltage allows power scavenging at high currents while generating less heat. Utilizing an integrated circuit, such as the LTC4079, allows the minimum voltage required to charge the battery at the low scavenge condition while limiting the maximum current going to the battery at the high condition in order to keep the battery working optimally.

Under normal operation when energy harvesting is required, current flows from current transformer 120, through the latching shunt to the rectifier(s). The rectified power is filtered by a filtering capacitor and sent to the downstream circuitry, such as a voltage regulator, for use or storage. As more power is generated from increased line current from current transformer 120, the voltage seen on net VSCAV increases if insufficient power is used by the downstream circuitry until it reaches the cumulative Zener breakdown voltage for the Zener diode(s). At this point, the voltage is clamped at the Zener voltage and the excess power passes through the loads and generates heat. The loads may be controlled via microcontroller 55 or similar logic to short one or more of the loads to lower the cumulative Zener breakdown voltage, and thereby reduce heat production. A high Zener voltage means that high power is dissipated across the diode(s). By shunting (shorting out) individual shuntable loads in the stack selectively, the power that needs to be dissipated is reduced, thereby limiting heating and allowing continuous charging even at high line currents.

Usage of a low magnetic saturation core for current transformer 120. Above the saturation point no additional current will be induced on the secondary side of the transformer. May be challenging to optimize using this, necessitating some experimentation.

The Zener stack may serve multiple purposes, such as:
clamping the voltage so that downstream components are not damaged from power surges from the current source;
shunting excess power from the charging circuit when the circuit cannot handle the excess current such as very high amperage power lines, thereby allowing continuous charging even under very high line currents;
improving low current scavenging by limiting current leakage at low currents;
thermal management
control/optimization of temperature in the device under higher line currents Other things that can be done:
by measuring the voltage/charging current on scavenging rectifier circuit 100, it may be determined whether current transformer 120 is fully closed even at low line currents
by switching in a burden resistor, the circuit may be used for line current measurement as well
shunts can be used to intermittently shunt current transformer 120 to limit charging/heating
the materials, winds, and core dimensions of current transformer 120 can be changed to optimize the design for different applications
a capacitor/inductor bank may optimize the design for maximum power transfer
Replace the CT with a multi tap CT
Other charging chips/circuits could be used
a supercap/capacitor bank could be used in place of the battery in some situations
Thermal management can be controlled either through a microcontroller or through other circuits Using a Zener diode with a high Zener voltage allows for optimization of the energy harvesting at low line currents while limiting the heat generated at high line currents. For low line currents, the main issue is that any and all Zener-type loads will leak some amount of current even before reaching a nominal Zener voltage (Vz) as specified in its characteristic current-voltage breakdown curve. While this leakage can be small in some cases, as the power handling capacity of a Zener diode increases, this leakage current increases as well and can be in the order of a few milliamps. This is a significant problem at a low line current because the amount of power that can be scavenged is in the same order of magnitude. As a result, at low line currents all the potentially harvestable power can be used up by the Zener diode's leakage. To get around this issue, a Zener diode with a significantly higher Zener voltage can be used successfully to limit leakage at low line currents. However, this limits its use at higher line currents due to heat production. Since current transformers are current sources, if excess current is induced on the secondary due to the line current and is not shunted to current transformer 120 return, the voltage across current transformer 120 leads will keep increasing until the voltage reaches the Zener voltage and the clamping action of the Zener diode begins. Depending on the Zener voltage used, this can generate a lot of heat. If for instance the battery is full, a 15V Zener diode is used, and the secondary current is 1 A due to the line current, 15 W must be dissipated by the device but if a 5.1V Zener diode was used then only 5.1 W must be dissipated.

Now by using multiple loads in series higher performance in both the low line and high line current situations can be achieved. In addition, the cost can be lower as multiple 5 W loads are much cheaper than purchasing a single 15 W one. Under the low line current condition, using a few low Zener voltage diodes in series provides a similar clamping voltage as a single 15V Zener diode (i.e. 3 5.1V loads in series for a 15.3V clamping voltage) with a similar low level of leakage current for good performance with low line currents. Under the high line current condition, the stack of 3 loads will generate a similar amount of heat as the 15V Zener diode. However, by shorting out the individual loads selectively the amount of heat generated can be reduced by increments. For instance, with the stack of three 5.1V Zener diodes with 1 A of current to be shunted, if one Zener diode is selectively shorted, the power dissipated will be 10.2 W and if two are shorted out only 5.1 W needs to be dissipated. This effectively increases the dynamic range that the device is capable of operating on as the amount of heat generated is controlled to a manageable level when excessive line currents are generated and increases the energy harvested at under the low line current conditions. As a result, a primary limiting factor becomes the power handling capability of the individual loads. This can also be managed by selecting diodes with lower Zener voltages and increasing the stack size as the amount of power increases.

As the amount of heat generated can be controlled when using the stack of selectively switchable loads, it makes energy harvesting under a wide range of line currents feasible in sealed devices. As used herein a load is "selectively shuntable" if it is operably coupled at opposite terminals thereof to a switchable shunt actively controlled as described herein. And a load is "selectively switchable" if it is selectively shuntable or otherwise effectively disabled by operation of a transistor, relay, or other such switching circuitry.

Furthermore, heatsinks are not necessarily required for the same reason. Another feature of this design is that since the amount of heat generated can be managed, it is still possible to charge the battery continuously under high line current conditions. If heat generation cannot be managed, then once the temperature rises too high, the CT must be shorted out and the device must be left to cool until it reaches the appropriate temperature then charging can be restarted.

By managing heat production better, this allows the device to charge continuously until the battery is full even under high line current conditions. This is particularly important if the device is to be deployed in areas where there are cyclical power loads that vary between high and low line current conditions below the self-sustaining point of the device. Since the device does not need to be periodically cooled down under high line current conditions, the effective charge time for a battery is much shorter so the device can tolerate much longer low line current conditions while requiring shorter high current periods as well.

Under higher line currents we can also utilize the selectively switchable loads to generate sufficient heat to provide the optimal operating temperature for the batteries. By switching the number of loads being shunted, the temperature of the enclosure could be raised and controlled to reach a set point in a similar way to a thermostat. Alternatively, it is conceivable that this could be use to deice the units in the event that they are covered in ice.

Other techniques for shorting out current transformer 120:

Rather than use transistors for shorting out the selectively switchable loads, relays could be used instead. However, these would take up much more space, they have a finite mechanical life, cost more energy to switch states, and is a much more expensive solution.

Bipolar junction transistors (BJTs) could be used instead of FETs as well. The drawback of this method is that additional power is consumed by the BJTs to put them into saturation mode for shorting out the loads. However, this power consumption can be relatively small and in the conditions where you would typically shunt the loads, there is excess power available.

Rather than use Zener diodes to regulate the output voltage to the load/excess power, a bank of resistors or other loads could be used. However, the voltage clamping action of the Zener diodes makes regulation much easier. Furthermore, as a resistor does not limit the output voltage, a current surge on the line would translate into a voltage spike into the energy harvesting circuitry which could potentially damage the circuitry so a voltage clamp is still required. In the event of a line fault, the surge in current on the power line can be in the order of 10 KA.

Variable load such as a potentiometer or a transistor operating in triode region. This method has the same limitations as a bank of resistors but allows for more finely tuning the applied load.

Constant current source drain to ground to split the current between what is sent to charge the battery and what is dissipated to ground. This is potentially a much more complicated solution but still would have issues with voltage spikes caused by a current surge on the line and may require tuning of feedback loops to operate properly In light of teachings herein, numerous existing techniques may be applied for configuring special-purpose circuitry or other structures effective for selecting and configuring appropriate circuitry (determining magnitudes and other parameters, e.g.) as described herein without undue experimentation. See, e.g., U.S. Pat. No. 9,876,384 ("Charging device and charging method"); U.S. Pat. No. 9,853,441 ("Voltage transient protection circuitry"); U.S. Pat. No. 9,831,669 ("Apparatus, system, and method for controlling power within a power-redundant system"); U.S. Pat. No. 9,806,527 ("Integrated electronics for perpetual energy harvesting"); U.S. Pat. No. 9,673,696 ("Ultra low-voltage circuit and method for nanopower boost regulator"); U.S. Pat. No. 9,653,926 ("Physical property sensor with active electronic circuit and wireless power and data transmission"); U.S. Pat. No. 9,543,072 ("Inductive power harvester with power limiting capability"); U.S. Pat. No. 9,529,021 ("Determining current"); U.S. Pat. No. 9,401,356 ("Power circuit, control method, power system, and package structure of power circuit"); U.S. Pat. No. 8,161,310 ("Extending and scavenging super-capacitor capacity"); and Application Note 308 by Christian Bach, published January 2009 by EnOcean. One skilled in the art will understand what is meant by "enough" as described herein, for example, without any undue experimentation.

All of the patents and other publications referred to above are incorporated herein by reference generally—including those identified in relation to particular new applications of existing techniques—to the extent not inconsistent herewith. While various system, method, article of manufacture, or other embodiments or aspects have been disclosed above, also, other combinations of embodiments or aspects will be apparent to those skilled in the art in view of the above disclosure. The various embodiments and aspects disclosed above are for purposes of illustration and are not intended to be limiting, with the true scope and spirit being indicated in the final claim set that follows.

In the numbered clauses below, specific combinations of aspects and embodiments are articulated in a shorthand form such that (1) according to respective embodiments, for each instance in which a "component" or other such identifiers appear to be introduced (with "a" or "an," e.g.) more than once in a given chain of clauses, such designations may either identify the same entity or distinct entities; and (2) what might be called "dependent" clauses below may or may not incorporate, in respective embodiments, the features of "independent" clauses to which they refer or other features described above.

Clauses

1. A power scavenging system comprising:
at least one rectifier (of a scavenging rectifier circuit 100, e.g.) across a secondary side 121B of a current transformer 120 (opposite a line side 121A thereof);
circuitry configured to harvest energy (by charging a storage apparatus of an energy harvesting circuit 190, e.g.) across one or more selectively switchable loads coupled across (opposite terminals of) an output of the rectifier selectively in response to an indication that a variable line current at a primary (line) side 121A of the current transformer 120 is small enough (not enough to cause damage to system 50, e.g.);
circuitry configured to shunt (i.e. short out) at least a first load 231, 432, 533 of the one or more selectively switchable loads coupled across the output of the rectifier selectively in response to an indication that a line current at the primary side (has grown and now) is large enough (high enough to create a risk of damage to the portable device, e.g.); and
circuitry configured to harvest energy across the first of the one or more selectively switchable loads coupled across the output of the rectifier again selectively in (conditional) response to an indication that a line current at the primary side (has become smaller and now) is again small enough.

2. The power scavenging system of system clause 1, wherein the indications 61 that the variable line current at the primary side 121A is small enough, that the line current at the primary side is large enough, and that the line current at the primary side is again small enough are each obtained as a measurement of current.

3. The power scavenging system of system clause 1, wherein the indications 62 that the variable line current at the primary side 121A is small enough, that the line current at the primary side is large enough, and that the line current at the primary side is again small enough are each obtained as a measurement of field strength.

4. The power scavenging system of ANY of the above system clauses, further comprising:
the current transformer 120, wherein the primary side 121A and the secondary side 121B are configured so that a number of windings on the secondary side is greater than a number of windings on the primary side.

5. The power scavenging system of ANY of the above system clauses, further comprising:
the current transformer 120, wherein the primary side 121A and the secondary side 121B are configured so that a number of windings on the secondary side is greater than a number of windings on the primary side and wherein the current transformer 120 incorporates a magnetic-saturation-limiting core on the secondary side 121B.

6. The power scavenging system of ANY of the above system clauses, wherein the power scavenging system is implemented entirely within a solid state portable device (with transistors and in lieu of relays, e.g.).

7. The power scavenging system of ANY of the above system clauses, wherein a microcontroller 55 is configured to disable the power scavenging system selectively in response to an indication that one or more storage devices 195 is fully charged.

8. The power scavenging system of ANY of the above system clauses, wherein at least one of the one or more selectively switchable loads has a (nominal) Zener voltage rated below 15 volts.

9. The power scavenging system of ANY of the above system clauses, wherein at least one of the one or more selectively switchable loads is an avalanche diode with a Zener voltage rated below 10 volts.

10. The power scavenging system of ANY of the above system clauses, wherein the indication that the variable line current at the primary side 121A of the current transformer 120 is an output voltage (at "C," e.g.) exceeding a voltage threshold.

11. The system of ANY of the above System Clauses, configured to perform ANY of the Method Clauses below.

12. A power scavenging method comprising:
configuring a rectifier (bridge rectifier 225, e.g.) across a secondary side 121B of a current transformer 120;
configuring circuitry to harvest energy across one or more selectively switchable loads 231, 431-432 coupled across an output of the rectifier selectively in response to an indication that a variable line current at a primary (line) side 121A of the current transformer 120 is small enough;
configuring circuitry to (nominally) shunt at least a first load 231, 432, 533 of the one or more selectively switchable loads coupled across the output of the rectifier selectively in response to an indication that a line current at the primary side 121A is large enough; and
configuring circuitry to harvest energy across the first load of the one or more selectively switchable loads coupled across the output of the rectifier again selectively in response to an indication that a line current at the primary side is again small enough (below a threshold, e.g.).

13. The power scavenging method of clause 12, wherein the one or more selectively switchable loads include only one Zener diode (optionally in series with a resistor in some variants that is also shunted, depicted as load 241).

14. The power scavenging method of clause 12, wherein the configuring the circuitry to shunt at least the first load 432, 533 of the one or more selectively switchable loads coupled across the output of the rectifier selectively in response to the indication that the line current at the primary side 121A is large enough comprises:
maintaining a second load 441, 541 operably coupled in series with the first Z load (in a load stack 535, e.g.) and selectively in an on state (i.e. not shunted) while the first load is selectively shorted out (shunted for more than a second, e.g.).

15. The power scavenging method of ANY of the above method clauses, further comprising:
obtaining the indications 62 that the variable line current at the primary side 121A is small enough, that the line current at the primary side is large enough, and that the line current at the primary side is again small enough each as a respective measurement of temperature (measured at sensor unit 52 and each compared with a threshold expressed in thermal units, e.g.).

16. The power scavenging method of ANY of the above method clauses, further comprising:

configuring circuitry to shunt the first load 432, 533 of the one or more selectively switchable loads coupled across the output of the rectifier selectively in response to the indication that a line current at the primary side 121A is again large enough; and configuring circuitry to shunt a second load 431, 532 of a load stack 435, 535 coupled across the output of the rectifier partly based on an indication that a line current at the primary side 121A is still large enough even with the first load 432, 533 being shunted and partly based on an indication that the load stack is hot enough (above an installer-specified threshold, e.g.) even with the first load 432, 533 being shunted, wherein the load stack 435, 535 includes the first and second selectively switchable loads operably coupled (directly or otherwise) in series.

17. The power scavenging method of ANY of the above method clauses, further comprising:

generating a diagnostic determination whether or not the current transformer 120 is fully closed at a (nominally) low line current by measuring a voltage on a scavenging rectifier circuit 100 that includes the rectifier.

18. The power scavenging method of ANY of the above method clauses, further comprising:

generating a diagnostic determination whether or not the current transformer 120 is fully closed at a (nominally) low line current by measuring a charging current on a scavenging rectifier circuit 100 that includes the rectifier.

What is claimed is:

1. A power scavenging system comprising:
   at least one rectifier across a secondary side of a current transformer;
   circuitry configured to harvest energy across one or more selectively switchable loads coupled across an output of said rectifier selectively in response to an indication that a variable line current at a primary side of said current transformer is small enough wherein said indication that said variable line current at that primary side of said current transformer is small enough is obtained as a measurement of current or is obtained as a measurement of field strength;
   circuitry configured to shunt at least a first selectively switchable load of said one or more selectively switchable loads coupled across said output of said rectifier selectively in response to an indication that a line current at said primary side is large enough wherein said indication that said line current at said primary side is large enough is obtained as a measurement of current or is obtained as a measurement of field strength; and
   circuitry configured to harvest energy across said first selectively switchable load of said one or more selectively switchable loads coupled across said output of said rectifier again selectively in response to an indication that a line current at said primary side is again small enough wherein said indication that said line current at said primary side is again small enough is obtained as a measurement of current or is obtained as a measurement of field strength.

2. The power scavenging system of claim 1, wherein said indications that said variable line current at said primary side is small enough, that said line current at said primary side is large enough, and that said line current at said primary side is again small enough are each obtained as a measurement of current.

3. The power scavenging system of claim 1, wherein said indications that said variable line current at said primary side is small enough, that said line current at said primary side is large enough, and that said line current at said primary side is again small enough are each obtained as a measurement of field strength.

4. The power scavenging system of claim 1, further comprising:
   the current transformer, wherein said primary side and said secondary side are configured so that a number of windings on said secondary side is greater than a number of windings on said primary side.

5. The power scavenging system of claim 1, further comprising:
   the current transformer, wherein said primary side and said secondary side are configured so that a number of windings on said secondary side is greater than a number of windings on said primary side and wherein said current transformer incorporates a magnetic-saturation-limiting core on said secondary side.

6. The power scavenging system of claim 1, wherein said power scavenging system is implemented entirely within a solid state portable device.

7. The power scavenging system of claim 1, wherein a microcontroller is configured to disable said power scavenging system selectively in response to an indication that one or more storage devices is fully charged.

8. The power scavenging system of claim 1, wherein at least said first selectively switchable load is a Zener diode with a Zener voltage rated below 15 volts.

9. The power scavenging system of claim 1, wherein said indication that said variable line current at that primary side of said current transformer is small enough is obtained as a measurement of current.

10. The power scavenging system of claim 1, wherein said indication that said variable line current at that primary side of said current transformer is small enough is obtained as a measurement of field strength.

11. The power scavenging system of claim 1, wherein said indication that said line current at said primary side is large enough is obtained as a measurement of current.

12. The power scavenging system of claim 1, wherein said indication that said line current at said primary side is large enough is obtained as a measurement of field strength.

13. The power scavenging system of claim 1, wherein said indication that said line current at said primary side is again small enough is obtained as a measurement of current.

14. The power scavenging system of claim 1, wherein said indication that said line current at said primary side is again small enough is obtained as a measurement of field strength.

15. A power scavenging method comprising:
   configuring a rectifier across a secondary side of a current transformer;
   configuring circuitry to harvest energy across one or more selectively switchable loads coupled across an output of said rectifier selectively in response to an indication that a variable line current at a primary side of said current transformer is small enough;
   configuring circuitry to shunt at least a first selectively switchable load of said one or more selectively switchable loads coupled across said output of said rectifier selectively in response to an indication that a line current at said primary side is large enough; and
   configuring circuitry to harvest energy across said first selectively switchable load of said one or more selectively switchable loads coupled across said output of said rectifier again selectively in response to an indication that a line current at said primary side is again small enough; and at least one of (1) generating a diagnostic determination whether or not said current transformer is fully closed at a low line current by measuring a voltage on a scavenging rectifier circuit that includes said rectifier; or
(2) generating a diagnostic determination whether or not said current transformer is fully closed at a low line current by measuring a charging current on a scavenging rectifier circuit that includes said rectifier; or
(3) obtaining said indications that said variable line current at said primary side is small enough, that said line current at said primary side is large enough, and that said line current at said primary side is again small enough each as a respective measurement of temperature; or
(4) both configuring circuitry to shunt said first selectively switchable load of said one or more selectively switchable loads coupled across said output of said rectifier selectively in response to said indication that a line current at said primary side is again large enough and configuring circuitry to shunt a second selectively switchable load of a load stack coupled across said output of said rectifier partly based on an indication that a line current at said primary side is still large enough even with said first selectively switchable load being shunted and partly based on an indication that said load stack is hot enough even with said first selectively switchable load being shunted, wherein said load stack includes said first and second selectively switchable loads operably coupled in series.

16. The power scavenging method of claim 15, further comprising:
obtaining said indications that said variable line current at said primary side is small enough, that said line current at said primary side is large enough, and that said line current at said primary side is again small enough each as a respective measurement of temperature.

17. The power scavenging method of claim 15, further comprising:
configuring circuitry to shunt said first selectively switchable load of said one or more selectively switchable loads coupled across said output of said rectifier selectively in response to said indication that a line current at said primary side is again large enough; and
configuring circuitry to shunt a second selectively switchable load of a load stack coupled across said output of said rectifier partly based on an indication that a line current at said primary side is still large enough even with said first selectively switchable load being shunted and partly based on an indication that said load stack is hot enough even with said first selectively switchable load being shunted, wherein said load stack includes said first and second selectively switchable loads operably coupled in series.

18. The power scavenging method of claim 15, further comprising:
generating a diagnostic determination whether or not said current transformer is fully closed at a low line current by measuring a voltage on a scavenging rectifier circuit that includes said rectifier.

19. The power scavenging method of claim 15, further comprising:
generating a diagnostic determination whether or not said current transformer is fully closed at a low line current by measuring a charging current on a scavenging rectifier circuit that includes said rectifier.

20. A power scavenging method comprising:
configuring a rectifier across a secondary side of a current transformer;
configuring circuitry to harvest energy across one or more selectively switchable loads coupled across an output of said rectifier selectively in response to an indication that a variable line current at a primary side of said current transformer is small enough;
configuring circuitry to shunt at least a first selectively switchable load of said one or more selectively switchable loads coupled across said output of said rectifier selectively in response to an indication that a line current at said primary side is large enough; and
configuring circuitry to harvest energy across said first selectively switchable load of said one or more selectively switchable loads coupled across said output of said rectifier again selectively in response to an indication that a line current at said primary side is again small enough, wherein said configuring said circuitry to shunt at least said first selectively switchable load of said one or more selectively switchable loads coupled across said output of said rectifier selectively in response to said indication that said line current at said primary side is large enough comprises:
maintaining a second selectively switchable load operably coupled in series with said first selectively switchable load and selectively in an on state while said first selectively switchable load is selectively shorted out.

* * * * *